United States Patent [19]

Reusens et al.

[11] Patent Number: 4,733,219
[45] Date of Patent: Mar. 22, 1988

[54] CONVERTER CIRCUIT

[75] Inventors: Peter P. F. Reusens, Destenbergen; Jozef D. G. L. Cannaerts, Zaventem, both of Belgium

[73] Assignee: Alcatel N.V., Amsterdam, Netherlands

[21] Appl. No.: 19,443

[22] Filed: Feb. 26, 1987

[30] Foreign Application Priority Data

Feb. 27, 1986 [BE] Belgium ............................... 2/60933

[51] Int. Cl.[4] ............................................. H03M 7/32
[52] U.S. Cl. ....................... 340/347 DD; 340/347 DA
[58] Field of Search ................ 340/347 AD, 347 MT, 340/347 DD, 347 DA; 375/27, 28, 33; 332/11 D

[56] References Cited

U.S. PATENT DOCUMENTS 3,793,513  2/1974  Kameko .................................. 375/28
4,301,446  11/1981  Petit .............................. 340/347 AD

FOREIGN PATENT DOCUMENTS 0084353  7/1983  European Pat. Off. .

OTHER PUBLICATIONS

"Design Methodology for ΣΔM", Agrawal and Shenoi, IEEE Transactions on Communications, vol. COM-31, No. 3, Mar. 1983.
"A 3-μm CMOS Digital CODEC with Programmable Echo Cancellation and Gain Setting," IEEE Journal of Solid-State Circuits, vol. SC-20, No. 3, Jun. 1985.

Primary Examiner—Charles D. Miller
Attorney, Agent, or Firm—Christie, Parker & Hale

[57] ABSTRACT

A prior art digital Delta-Sigma converter is improved by including a second control loop with a second forward branch coupled between the first and second subtractor circuits and a third subtractor circuit coupled in series to the first integrator circuit and with a second feedback branch and a third subtractor circuit coupled to the output of said first integrator circuit. When the input signal is equal to zero the output signal of the first integrator circuit will rapidly change to zero because the second control loop applies an additional feedback signal to the third subtractor circuit and therefore also to the first integrator circuit. Because the output signal of the first integrator output circuit signal thus more rapidly varies to zero the same is true for the output signal of the second integrator circuit and therefore also for the converter output signal.

10 Claims, 7 Drawing Figures

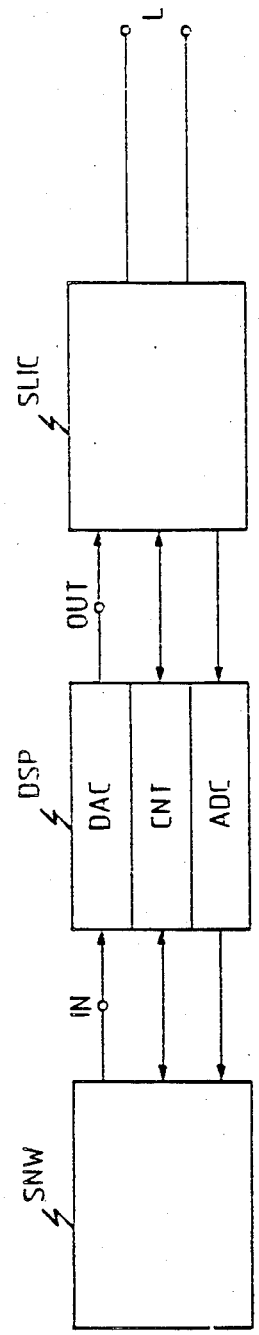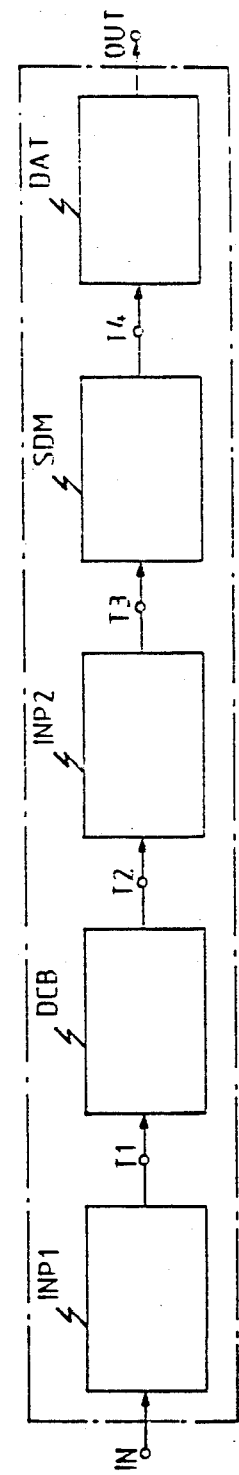

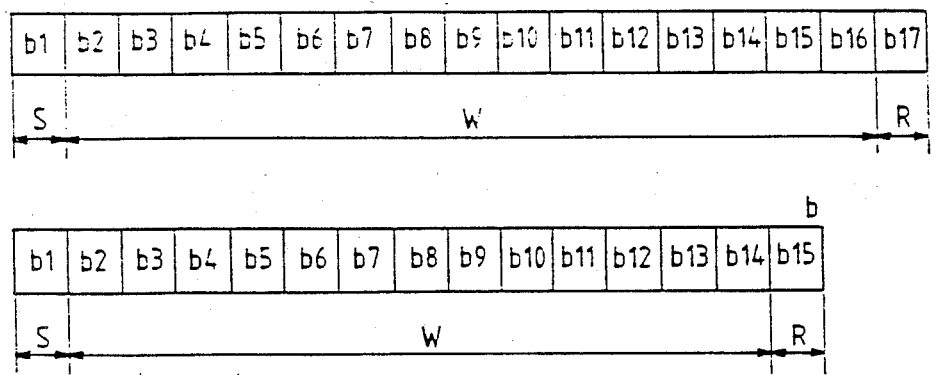
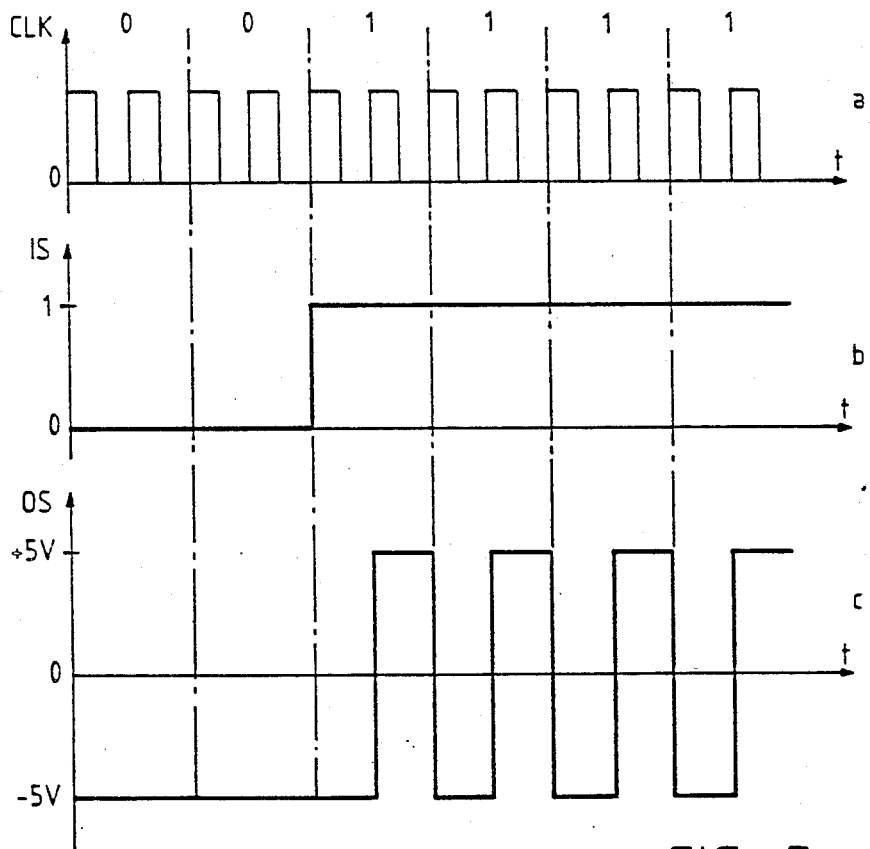
FIG. 6
FIG. 7

CONVERTER CIRCUIT

FIELD OF THE INVENTION

The present invention relates to improvements to a known type of digital Delta-Sigma converter circuit.

BACKGROUND ART

A prior art digital Delta-Sigma converter is disclosed in the article entitled "A 3-$\mu$ CMOS Digital Codec with programable Echo Cancellation and Gain Setting" by P. Defraeye et al, published in the IEEE JOURNAL OF SOLID-STATE CIRCUITS, Vol. SC-20, No. 3, June 1985, pp. 679 to 687.

In this known converter both the first and second integrator circuits operate at a frequency which is a multiple of the frequency of the input signal. Furthermore, each of the integrator circuits includes an internal feedback circuit coupled to a digital subtracting circuit so as to retain the information contained therein. When this known converter circuit is in its idle start condition and an input signal equal to zero is applied to it, the output signal of the circuit assumes an idle condition too, however, when the input signal becomes equal to zero after having been non-zero for some time the output signal will not exactly follow the input signal due to the presence in the circuit of previous information.

BRIEF SUMMARY OF THE DISCLOSED INVENTION

An object of the present invention is to provide a converter of the above type, but wherein unwanted low frequency components in the converter output signal are considerably reduced. This may be accomplished by including a second control loop with a second forward branch coupled between the first and second subtractor circuits and a third subtractor circuit coupled in series to the first integrator circuit and with a second feedback branch and a third subtractor circuit coupled to the output of said first integrator circuit. When the input signal is equal to zero the output signal of the first integrator circuit will rapidly change to zero because the second control loop applies an additional feedback signal to the third subtractor circuit and therefore also to the first integrator circuit. Because the output signal of the first integrator output circuit signal thus more rapidly varies to zero the same is true for the output signal of the second integrator circuit and therefore also for the converter output signal.

BRIEF DESCRIPTION OF THE DRAWINGS

The above mentioned and other objects and features of the invention will become more apparent and the invention itself will be best understood by referring to the following description of an embodiment taken in conjunction with the accompanying drawings wherein:

FIG. 1 is a simplified block diagram of a telecommunication switching system DTS with a digital-to-analog conversion circuit DAC including a converter according to the invention;

FIG. 2 is a block diagram of this conversion circuit DAC of FIG. 1;

FIGS. 6a and b show digital words appearing in this conversion circuit;

FIG. 7 represents input and output signals appearing in the converter of FIG. 5.

DETAILED DESCRIPTION OF A PRESENTLY PREFERRED EMBODIMENT

The digital telecommunication switching system DTS shown in FIG. 1 includes a digital signal processor DSP located between a switching network SNW and a subscriber line interface circuit SLIC which is itself connected to a telecommunication line L.

The DSP includes an analog-to-digital conversion circuit ADC to convert analog signals received via the SLIC from the telecommunication Line L into the digital signals used by the SNW, a digital-to-analog conversion circuit DAC to convert digital signals received from the SNW into analog signals which are then transmitted to the telecommunication line L via the SLIC and a control portion CNT bi-directionally coupled to SNW and SLIC and able to control the operation of both the ADC and the DAC.

The digital-to-analog conversion circuit DAC of the DSP will now be described in more detail with reference to FIG. 2.

This circuit has an input terminal IN to which the SNW is connected and an output terminal OUT connected to the SLIC. It comprises the series connection of a first interpolator and filter INP1, a DC blocking circuit DCB, a second interpolator INP2, a converter or Sigma-Delta modulator SDM and a digital-to-analog transformer DAT. The input terminal IN is connected to an input of INP1 and an output of the digital-to-analog transformer DAT is connected to the output terminal OUT. The terminals connecting INP1 to DCB, DCB to INP2, INP2 to SCM and SCM to DAT are indicated by T1, T2, T3 and T4 respectively.

The first interpolator and filter INP1 whose purpose will be explained later mainly includes a fourth order Infinite Response Filter (not shown).

Figure 3:
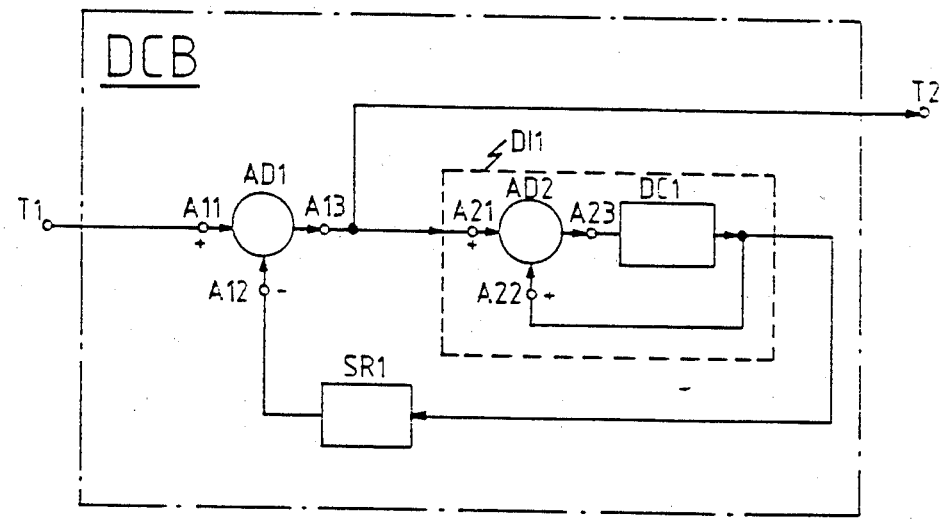
FIGS. 3, 4, and 5 represent in more detail a DC blocking circuit DCB, and interpolator INP2 and the above mentioned converter, all forming part of the conversion circuit.

The DC blocking circuit DCB is represented in more detail in FIG. 3. It includes a subtractor circuit in the form of an algebraic adder or summing network AD1 with a summing (+) input A11 connected to the terminal T1, a subtracting (−) input A12, and an output A13 connected to terminal T2 as well as to a first summing (+) input A21 of a second subtractor circuit (algebraic adder) AD2 included in a digital integrator DI1 also forming part of DCB. DI1 also includes a delay circuit DC1 which has an input and an output respectively connected to an output A23 and to a second summing (+) input A22 of AD2. The output of DC1 which is also the output of DI1 is further fed back to a subtracting (−) input A12 of AD1 via a divider realized by a shift register SR1 also included in DCB.

Figure 4:
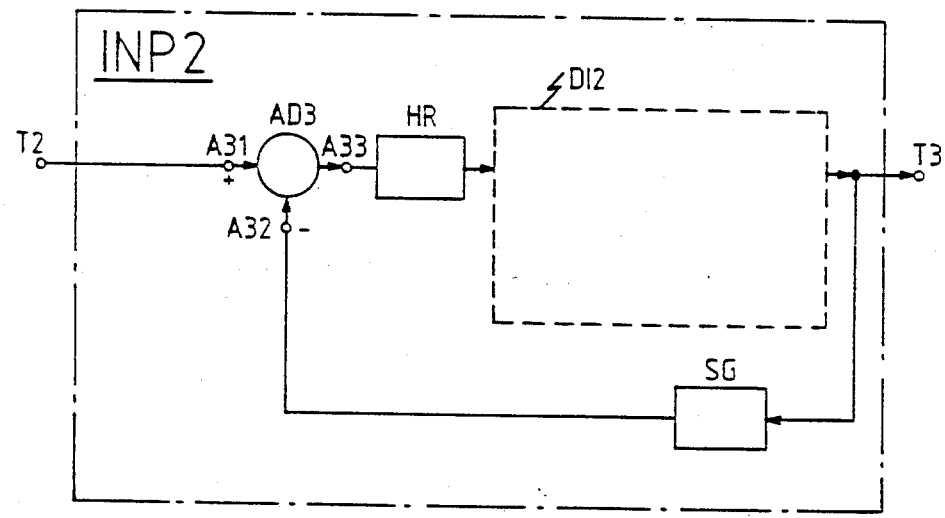

The second interpolator INP2 is represented in FIG. 4. It includes a third subtracting circuit (algebraic adder) AD3 with a summing (+) input A31 connected to terminal T2, a subtracting (−) input A32, and an output A33 to which a subtracting (−) input A32, and an output A33 to which a digital integrator D12 included in INP2 is connected via a hold register HR. An output of DI2 is connected to the terminal T3 directly and via a sampling gate SG also forming part of INP2 to the subtracting (−) input A32 of AD3. It is to be noted that the digital integrator DI2 is similar to and operates in the same way as DI1 described above.

Figure 5:
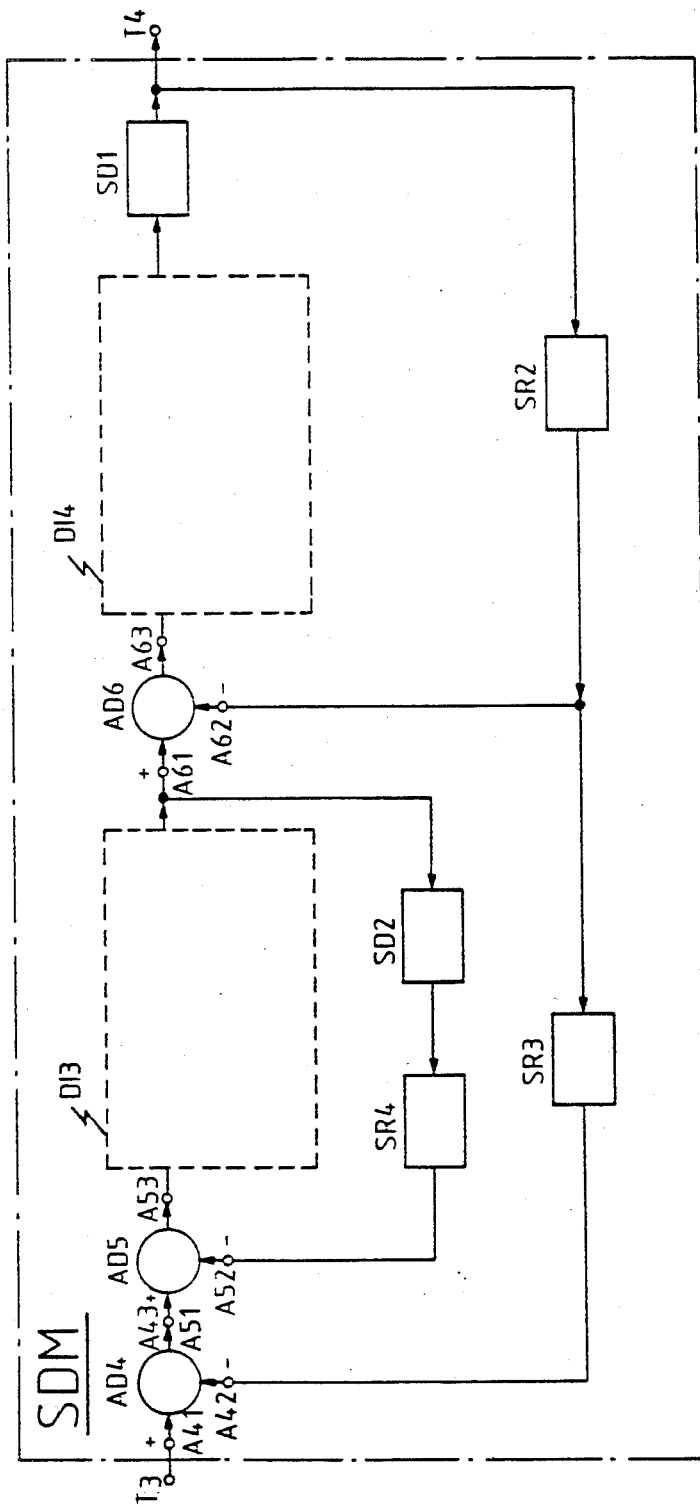

The converter of Sigma-Delta modulator SDM is represented in FIG. 5 and has an input terminal T3 and an output terminal T4. It includes three subtracting circuits (algebraic adders) AD4, AD5 and AD6, two digital integrators DI3 and DI4, two sign detectors SD1 and SD2 and three shift registers SR2, SR3 and SR4. Adder AD4 has a summing (+) input A41 connected to terminal T3, a subtracting (−) input A42, and an output A43 connected to a summing (+) input A51 of the adder AD5 which further has a subtracting (−) input A52 and an output A53. Digital integrator DI3 has an input connected to the output A53 of AD5, and an output connected to the subtracting (−) input A52 of AD5 via the series connection of the sign detector SD2 and the shift register SR4 forming a feedback control path. The output of DI3 is also connected to a summing (+) input A61 of adder AD6 which further has a subtracting (−) input A62 and an output A63 to which an input of digital integrator DI4 is connected. DI4 has an output connected to the terminal T4 via the sign detector SD1. Terminal T4 is connected to the subtracting (−) input A62 of AD6 via a feedback control path formed by the shift register SR2, and is further connected to the subtracting (−) input A42 and AD4 via another feedback control path formed by shift registers SR2 and SR3 in series. It is to be noted that the digital integrators DI3 and DI4 may both be identical to DI1 described above.

The above described digital-to-analog conversion circuit DAC of the digital signal processor DSP operates as follows:

SNW supplies a Time Division Multiplex (TDM) signal constituted by 13 bit linear coded digital words having a word frequency of 8 kHz to the input terminal IN of DAC. Negative digital words are represented in the two's complement form. The Most Significant Bit MSB of each of these digital words is a sign bit whose binary value 0/1 indicates that the word has a positive/negative digital value.

In the interpolator and filter INP1 the 13 bit digital words supplied by SNW are transformed into 17 bit digital words having sampling or a word frequency of 32 kHz. The contents of such a 17 bit digital word is represented in FIG. 6a: the MSB or first bit b1 is the sign bit S, the 15 following bits b2 to b16 represent the integer portion W of the digital word and the Least Significant Bit LSB which is the last bit b17 is a rounding bit R or the decimal portion of the digital word. It should be noted that internally the INP1 will typically operate on digital words having more than 17 bits to increase its operational accuracy.

In the DC blocking circuit DCB each of the 17 bit input digital words received at a frequency of 32 kHz on input terminal T1 is applied to input terminal A11 of the adder circuit AD1. Therein, this 17 bit digital word is rounded by adding the rounding bit R=b17 to the integer portion W=b2/b16 of this digital word. The rounding operation is preferred over a truncation of the last bit b17 because it has been found that in this case the noise error has an average value of about zero. This means that these digital words practically have no DC error component. In AD1, a 16 bit feedback digital word applied to the input A12 is subtracted from the rounded 16 bit input digital word and the resultant 16 bit difference digital word is transformed into a 19 bit digital word before being applied to the digital integrator DI1. This is done to improve the operational accuracy of this integrator; however, only 17 bits of each such 19 bit word are supplied to the output terminal T2. DI1 comprises an adder circuit AD2 wherein the 19 bit digital word applied to input terminal A21 is added to the feedback word generated at the output of the delay circuit DC1 which provides a delay equal to one sampling or word period. This 19 bit feedback word is also reduced to a 16 bit word and then divided by $2^N$, wherein N is an integer, before being applied to the input A12 of AD1. This division is performed in the shift register SR1 by shifting the word N times to the right.

Without considering the lengths of the digital words, the circuit DCB operates as follows when starting from the rest condition.

Because at the rest condition no feedback word is present at the input terminal A12 of AD1 the first digital word received on the input terminal A11 of AD1 is supplied to output terminal T2 as well as to the integrator circuit DI1. There, this word is submitted to a delay of one sampling period and then applied to the input terminal A22 of AD2 and, after division by 2N also to the input terminal A12 of AD1. At that moment the second input digital word is received at input terminal A11 of AD1 so that feedback word, derived from the first input digital word, is subtracted from this second input digital word. The resultant difference word obtained at the output of AD1 is then added in AD2 to the feedback word which is provided at the output of DC1 and was derived from the first input word, etc.

It may be calculated that in this way the feedback words at the output of DC1 become identical to the DC component of the input words applied to the input terminal T1 and that the words generated at the output terminal T2 are independent from this DC component.

The above mentioned 17 bit digital words supplied at the output terminal T2 of DCB at a frequency of 32 kHz are fed to the like named input terminal T2 of the interpolator circuit INP2. In the adder circuit AD3 thereof each of these words applied to the input terminal A31 is first rounded to a 16 bit word in a similar way as described above in relation to DCB, and then the feedback digital word applied to input terminal A32 of AD3 is subtracted from the rounded word. As will be explained later this feedback word is the digital word generated at the terminal T2 during the immediately preceding sampling period. Each difference digital word generated at the output terminal A33 of AD3 and having a value D equal to the difference of two successive samples, e.g. X and Y, is then stored in the hold register HR for a duration equal to a sampling period. The integrator circuit DI2 derives from each stored difference digital word of value D a series of 8 digital words with successive values $$X+D/8, X+2D/8, \ldots, X+D=Y$$

it being supposed that the delay circuit (not shown) in DI2 provides a delay equal to one eighth of a sampling period, i.e. the period between the above two samples X and Y. This happens in the following way:

The 16 bit word with value D is transformed by shifting into a 19 bit word having a value equal to D/8 and is applied to a first input terminal of the adder circuit in DI2. Because the word at the second input terminal of this adder circuit has a value equal to X, a 19 bit word having the value X+D/8 is generated at the output of this adder circuit. This word appears after a delay to ⅛th of the sampling period at the output terminal T3 of INP2.

The latter word is also applied to the second input of the adder circuit in D12 to the first input of which still the word with value D/b 8 is applied. Consequently, the word generated at the output of this adder circuit has a value equal to X+D/8 and appears at the output terminal T3 after a delay equal to 2/8th of the sampling period since the generation of the word with value X.

In a similar way the words with values X+3D/8 to X+7D/8 are generated at the output terminal T3 of INP2.

Finally at the end of the whole sampling period the value X+8D/8 or Y is generated at the output terminal T3 of INP2. At that moment the sampling gate SG is opened to apply the value Y to the input A32 of AD3 which then calculates the next difference value between the sample Y and Z for instance.

Only 15 bits of each of the 19 bit digital words generated at the output of INP2 at a frequency of 256 kHz are transmitted to the input terminal T3 of the Sigma-Delta modulator SDM (FIG. 5) because in the latter circuit a 14 bits precision is sufficient and a rounding operation to 14 bits only requires 15 bits. One of these 15 bit digital words is shown in FIG. 6b and comprises a sign bit S=b1 (MSB), an integer portion W constituted by 12 bits b2 to b13 and a decimal portion comprising bits b14 and b15 (LSB). The largest possible number representable is $2^{12}-1$, whilst the most negative number is $-2^{12}$ (in two's complement binary notation).

The Sigma-Delta modulator SDM is similar to the one described in the above mentioned article and mainly differs therefrom by the presence of the feedback loop comprising the circuits SD2, and SR4 and AD5. The purpose of the Sigma-Delta modulator SDM is to transform the 15 bit input digital words at a frequency of 1,024 kHz.

As already mentioned above, SD1 and SD2 are sign detectors whilst AD4 to AD5 are adders. SR2 is a shift register which provides at its output a word with value $+2^{13}$ or $-2^{13}$ depending on the value of the above 1 bit word. SR3 is a shift register used to perform a division by 2 so that it provides a value equal to $+2^{12}$ or $-2^{12}$ at its output. Finally, SR4 is a shift register which provides at its output a word with value +0.5 or −0.5 depending on the sign of the bit provided by SD2.

Each of the 15 bit digital words applied to the input terminal T3 of SDM is rounded in AD4 to a 14 bit digital word in the same way as described above in relation to DCB. In AD4 a feedback word applied to input terminal A42 and having a value equal to $+2^{12}$ or $-2^{12}$ is subtracted from the rounded word thus obtained and the resulting difference word appearing at output terminal A43 is applied to the input terminal A51 of adder AD5. Therein a feedback word applied to input A52 of AD5 and having a value equal to +0.5 or −0.5 is subtracted from the difference word and the resulting new difference word appearing at output terminal A53 of AD5 is applied to the digital integrator DI3 which operates at a freguency equal to 1,024 kHz. After integration in DI3 the output word thus obtained is supplied to the input of the feedback circuit SD2, SR4 as well as to the adder circuit AD6. Therein, a word having a value equal to $+2^{13}$ or $-2^{13}$ is subtracted from this output word and the resultant difference word is integrated in DI4 which also operates at a frequency equal to 1,024 kHz. The sign of this word is supplied to the output terminal T4 of SDM as well as to AD6 and AD4 via the feedback circuits SR2 and SR2, SR3 respectively.

Without the presence of SD2, SR4 and AD5 an undesirable property of the SDM is that when a series of non-zero input words is followed by, e.g., an input word equal to zero, the word at the output of SDM may have an average non-zero value for a time interval much longer than the time during which the input is equal to zero. Indeed, when such an input word equal to zero is applied to T3, the non-zero digital word already present in the integrator DI3 and circulating therein is only affected by the feedback signal provided at the input A42 of AD4 so that the average value of the output word of DI3 and therefore also of DI4 only slowly varies towards zero. This gives rise to unwanted low frequency components at the output terminal T4.

In the present circuit such unwanted low frequency components are drastically reduced by the feedback path SD2, SR4 of DI3. Indeed, the sign detector SD2 extracts the sign bit from the digital word appearing at the output of DI3 and supplies it to the shift register SR4 which generates a digital word equal to +0.5 or −0.5 for a positive or a negative sign respectively. This digital word +0.5 or −0.5 is represented using bit b15 in FIG. 6 and is then supplied to the subtracting input A52 of AD5 in order to more rapidly decrease the value of the digital word stored in DI3. The feedback path SD2, and SR4 and AD5 thus forms a leakage path for the digital word contained in DI3 and brings the average value of the digital words at the output of DI3 more rapidly to zero, the digital word generated by SR4 corresponding to the leak. The leakage operating is not linear because a constant value +0.5 or −0.5 is subtracted from the digital words so that small digital words are more affected than large words. When the digital word contained in DI3 is positive the digital word +0.5 is subtracted from it, whereas when it is negative the digital word −0.5 is subtracted from it. A particular situation occurs when the value of the digital word stored in DI3 is equal to zero. If, in SD2, zero is considered as being positive, then +0.5 is subtracted via input terminal A52 because of the leakage path. In this case, the value of digital words at the output of DI3 has an average value which is not equal to zero but −0.25. The value at the output A61 of DI3 is further integrated by DI4 and would result in the SDM going to a substantially idle condition constituted by a 256 kHz square wave but with phase jumps occurring at regular intervals of the 1,024 kHz signal. These jumps will give rise to an unwanted but acceptable low frequency signal, e.g. below 100 Hz, at the output terminal T4.

In a preferred embodiment, SD2 provides a third output signal equal to zero when a signal equal to zero is applied at its input. In this case, the SDM reaches the real idle condition, i.e. a square wave of 256 kHz with no low frequency components.

A signal appearing at the input of the Sigma-Delta modulator SDM is thus affected by the above mentioned non linear leakage path and rounding. As already mentioned, this attenuation is larger for low signals, e.g. noise, than for the usual telecommunication signals, e.g. speech signals, which are practically unaffected. As a result, the noise threshold of the DAC is improved.

The 1 MHz pulse stream generated at the output terminal T4 of SDM is supplied to the digital-to-analog converter DAT which is able to convert this pulse stream into another having a pulse density which is function of the values of these pulses. To this end DAT operates at a 2 MHz clock frequency CLK using a coding technique known as return to zero coding as shown in FIG. 7 and in the following way: when an input pulse has the binary value 0 the value of the output signal generated at the terminal OUT is equal to $-5$ Volts during the two corresponding cycles of the 2 MHz clock CLK, whilst when the input signal has the binary value 1 the value of this output signal is equal to $-5$ Volts and to $+5$ Volts during the first and second cycles of the two corresponding clock cycles of CLK respectively.

An example is given in FIG. 7: a succession of binary values 001111 of the 1 MHz input pulse stream IS at terminal T4 is shown in FIG. 7b and the 2 MHz output signal OS at terminal OUT of DAT is shown in FIG. 7c. From these figures it follows that the output signal OS corresponding to an input pulse with binary value 1 has one raising edge and one falling edge, whilst the output signal OS corresponding to an input pulse with binary value 0 has no edges. As a consequence, the number of edges of the output signal is always even so that it has a reduced non-linear distortion. Furthermore, because the number of edges is small (no edge for a binary value 0 and only 2 edges for a binary value 1) the output signal OS is less sensitive to the possible jitter of the clock CLK and has less harmonics in the high frequency range.

However, by this conversion the analog output signal corresponding to OS contains a DC component with a known and fixed value which can be easily eliminated in practice by an analog amplifier and filter (not shown) coupled to the digital-to-analog converter DAT.

While the principles of the invention have been described above in connection with specific apparatus, it is to be clearly understood that this description is made only by way of example and not as a limitation on the scope of the invention.

We claim:
1. In a converter circuit of the type having
an input terminal, to which input signals to be converted are applied,
an output terminal,
a first subtractor circuit,
a first integrator circuit,
a second subtractor circuit,
a second integrator circuit,
said first subtractor, said first integrator, said second subtractor, and said second integrator circuits all being coupled between said input and said output terminals, and
a first feedback loop for coupling said output terminal to said second subtractor circuit as well as to said first subtractor circuit,
the improvement comprising:
a third subtractor circuit coupled between said first subtractor circuit and said first integrator circuit, and
a second feedback loop for coupling the output of said first integrator circuit to said third subtractor circuit.

2. A converter circuit according to claim 1, wherein said second feedback loop further comprises sign detection means for detecting the sign of the signal provided by said first integrator circuit and in response thereto applying either a first or a second signal value to said third subtractor circuit.

3. A converter circuit according to claim 2, wherein said first and second signal values are identical in absolute value but with an opposite sign.

4. A converter circuit according to claim 2, Wherein said sign detector means applies a third signal value to said third subtractor circuit when the signal provided by said first integrator circuit is equal to zero.

5. A converter circuit according to claim 4, wherein said third signal value is equal to zero.

6. A converter circuit according to claim 2, wherein said sign detector means further comprises:
a sign detector and
a circuit responsive to the output from said sign detector for providing said first and second signal values in response to the output of said sign detector.

7. A Converter circuit according to claim 6, wherein said sign detector provides three distinct output signals respectively corresponding to positive, negative and zero signals at the output of said first integrator circuit.

8. A converter circuit according to claim 1 further comprising a DC blocking circuit through which said converter input signal is applied to said first subtractor circuit.

9. A converter circuit according to claim 8, wherein said DC blocking circuit further comprises a fourth subtractor circuit, a third integrator circuit and a third feedback loop coupled from said third integrator circuit to said fourth subtractor circuit.

10. A converter circuit according to claim 8, further comprising an interpolator circuit coupled between the output of said DC blocking circuit and said first subtractor circuit.

* * * * *

UNITED STATES PATENT AND TRADEMARK OFFICE
CERTIFICATE OF CORRECTION

PATENT NO. : 4,733,219

DATED : March 22, 1988

INVENTOR(S) : Reusens et al.

It is certified that error appears in the above-identified patent and that said Letters Patent is hereby corrected as shown below:

In the Specification

Column 5  Change "D/b 8" to -- D/8 --
Line 5

Column 8  After "claim 2," Change "Wherein" to
Line 22   -- wherein --

Signed and Sealed this

Tenth Day of January, 1989

Attest:

DONALD J. QUIGG

Attesting Officer    Commissioner of Patents and Trademarks